United States Patent
Fuyutsume et al.

(10) Patent No.: US 8,997,320 B2
(45) Date of Patent: *Apr. 7, 2015

(54) METHOD FOR MANUFACTURING ACOUSTIC WAVE DEVICE

(75) Inventors: Toshiyuki Fuyutsume, Kyoto (JP); Taro Nishino, Kyoto (JP); Hisashi Yamazaki, Kyoto (JP); Noboru Tamura, Yamanashi (JP); Nakaba Ichikawa, Yamanashi (JP); Masaki Aruga, Yamanashi (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 651 days.

This patent is subject to a terminal disclaimer.

(21) Appl. No.: 12/864,060

(22) PCT Filed: Nov. 26, 2008

(86) PCT No.: PCT/JP2008/071415
§ 371 (c)(1), (2), (4) Date: Jul. 22, 2010

(87) PCT Pub. No.: WO2009/093376
PCT Pub. Date: Jul. 30, 2009

(65) Prior Publication Data
US 2010/0293770 A1   Nov. 25, 2010

(30) Foreign Application Priority Data
Jan. 24, 2008 (JP) .................. 2008-013633

(51) Int. Cl.
*H03H 3/02* (2006.01)
*H03H 3/007* (2006.01)
(Continued)

(52) U.S. Cl.
CPC .............. *H03H 3/02* (2013.01); *H03H 3/007* (2013.01); *H03H 3/04* (2013.01); *C23C 4/06* (2013.01); *H03H 3/10* (2013.01); *H03H 9/02559* (2013.01); *C23C 4/04* (2013.01); *C23C 4/10* (2013.01)

(58) Field of Classification Search
CPC ........... H03H 3/02; H03H 3/04; H03H 3/007; H03H 3/10; H03H 9/025559; C23C 4/04; C23C 4/06; C23C 4/10
USPC ......... 29/25.35, 842, 846, 594; 427/447, 448, 427/452, 455, 453; 428/304.4, 306.8, 428/310.5, 311.1, 446; 310/313 R, 313 B, 310/340

See application file for complete search history.

(56) References Cited

U.S. PATENT DOCUMENTS 4,436,538 A * 3/1984 Tomita et al. .......... 428/310.5 X
6,110,853 A * 8/2000 Berger et al. ............. 428/446 X
(Continued)

FOREIGN PATENT DOCUMENTS

JP       06-326553 A     11/1994
JP       2001111378 A *   4/2001
(Continued)

OTHER PUBLICATIONS

Machine Language Translation of Japanese Patent Publication, JP 2001-111378, Jul. 2014.*

*Primary Examiner* — A. Dexter Tugbang
(74) *Attorney, Agent, or Firm* — Harness, Dickey & Pierce, PLC

(57) ABSTRACT

Provided is a method for manufacturing an acoustic wave device that has an excellent temperature coefficient of frequency (TCF) and high accuracy of IDT pattern forming and is capable of resisting high temperature processing of 200 degrees or more. The method for manufacturing an acoustic wave device according to the present invention includes forming an IDT (2) on a principal surface (1a) of a piezoelectric substrate (1), and forming a film by thermal spraying a material (3) having a smaller linear thermal expansion coefficient than the piezoelectric substrate onto an opposite principal surface (1b) of the piezoelectric substrate (1) where the IDT (2) is formed.

12 Claims, 4 Drawing Sheets

(51) Int. Cl.
*H03H 3/04* (2006.01)
*C23C 4/06* (2006.01)
*H03H 3/10* (2006.01)
*H03H 9/02* (2006.01)
*C23C 4/04* (2006.01)
*C23C 4/10* (2006.01)

(56) References Cited

U.S. PATENT DOCUMENTS 6,254,938 B1 * 7/2001 Pranevicius et al. .......... 427/453
7,067,178 B2 * 6/2006 Muto et al. .................... 427/448
7,589,452 B2 * 9/2009 Hauser et al. ................. 310/340
2008/0024037 A1 1/2008 Tamura et al.

FOREIGN PATENT DOCUMENTS

| | | | |
|---|---|---|---|
| JP | 2001-196894 | | 7/2001 |
| JP | 2002-016468 A | | 1/2002 |
| JP | 2005-229455 A | | 8/2005 |
| JP | 2008-054276 A | | 3/2008 |
| WO | WO 2006/032335 | * | 3/2006 |

* cited by examiner (a)

(b)

(c)

(a)

(b)

(c)

(d)

(a)

(b)

X

METHOD FOR MANUFACTURING ACOUSTIC WAVE DEVICE

TECHNICAL FIELD

The present invention relates to a method for manufacturing an acoustic wave device such as a surface acoustic wave (SAW) device and a boundary acoustic wave device.

BACKGROUND ART

The acoustic wave device is a device having an inter-digital transducer (IDT) formed on a piezoelectric substrate such as lithium tantalate ($LiTaO_3$:LT) substrate or lithium niobate ($LiNbO_3$:LN) substrate. The LT and LN have high thermal expansion coefficients that are six times higher than the thermal expansion coefficient of silicon (the thermal expansion coefficients of LT and LN are about $16 \times 10^{-6}$/K and $15 \times 10^{-6}$/K, respectively, while the thermal expansion coefficient of silicon is about $2.6 \times 10^{-6}$/K). Then, if the LT or LN substrate is used in the acoustic wave device, there arises a significant problem of change in filtering performance due to temperature change. Therefore, temperature compensation is performed in various methods.

For example, the patent document 1 discloses a technique of bonding a thinned piezoelectric substrate and an amorphous piezoelectric substrate for temperature compensation directly or via an inorganic thin layer. Besides, the patent document 2 discloses bonding an insulating substrate for temperature compensation and an IDT-formed and then thinned piezoelectric substrate with use of an adhesive member made of glass material.

[Patent document 1] Japanese Patent Application Laid-Open No. H6-326553
[Patent document 2] Japanese Patent Application Laid-Open No. 2002-16468

DISCLOSURE OF THE INVENTION

When a bonded substrate formed of a piezoelectric substrate and a substrate for temperature compensation bonded together is set in the wafer process or, for example, when an IDT for an acoustic wave device is formed on the bonded substrate, there occurs, in a heating step of the process, a stress due to a difference in linear thermal expansion coefficient between the piezoelectric substrate and the substrate for temperature compensation, warping the piezoelectric substrate, which finally causes deterioration in accuracy of line width processing. Besides, in the wafer process, the processing is sometimes performed at temperatures of 200 degrees or more. When the bonded substrate is provided at such temperatures, there occurs a stress due to a difference in linear thermal expansion coefficient, which may cause a crack in the substrate and peel-off in a bonded surface.

The present invention was made in view of the foregoing, and has an object to provide a method for manufacturing an acoustic wave device that has an excellent temperature coefficient of frequency (TCF) and high accuracy of IDT pattern forming and is capable of resisting high temperature processing of 200 degrees or more.

The method for manufacturing an acoustic wave device according to the present invention includes the steps of forming an IDT on a principal surface of a piezoelectric substrate, and forming a film by thermal spraying a material having a smaller linear thermal expansion coefficient than the piezoelectric substrate on an opposite principal surface of the piezoelectric substrate on which the IDT is formed.

According to this method, the thermal spray film, which exhibits the temperature compensating effect, is formed after the IDT is formed on the piezoelectric substrate. As the IDT is first formed on the piezoelectric substrate, there do not occur problems of the bonded substrate, such as warpage of the substrate due to stress caused by a difference in linear thermal expansion coefficient or crack in the substrate in the high-temperature process. Then, as the IDT can be formed in the unwarped substrate, it is possible to obtain the acoustic wave device with high accuracy of IDT forming. Further, as the thermal spray film that exhibits the temperature compensating effect is formed after the IDT is formed, it is possible to enhance the temperature compensation effect of the thus-obtained acoustic wave device while keeping the high accuracy of IDT forming.

Preferably, the method for manufacturing the acoustic wave device according to the present invention further comprises, before forming of the film by thermal spraying, roughening the opposite principal surface of the piezoelectric substrate. According to this method, it is possible to obtain the acoustic wave device not affected by the bulk acoustic wave. In this method, it is preferable that the opposite principal surface has Ra of 0.01 μm to 3 μm.

Preferably, the method for manufacturing the acoustic wave device according to the present invention further comprises, before forming of the film by thermal spraying, thinning the piezoelectric substrate by reducing a thickness at a side of the opposite principal surface of the piezoelectric substrate. According to this method, it is possible to enhance the temperature compensation effect of the obtained acoustic wave device.

In the method for manufacturing the acoustic wave device according to the present invention, it is preferable that at least one selected from the group consisting of mullite, alumina, silicon and yttria may be used as the material.

In the method for manufacturing the acoustic wave device according to the present invention, it is preferable that the piezoelectric substrate is a lithium tantalate substrate or a lithium niobate substrate.

Preferably, the method for manufacturing the acoustic wave device according to the present invention further comprises a step of filling pores in the film formed by thermal spraying with a filling material. According to this method, the rigidity of the thermal spray film is increased to enhance the TCF.

According to the method for manufacturing an acoustic wave device of the present invention, the IDT is formed on one principal surface of the piezoelectric substrate and a film is formed by thermal spraying a material having a smaller linear thermal expansion coefficient than the piezoelectric substrate on the opposite principal surface of the piezoelectric substrate on which the IDT is formed. With this method, it is possible to provide an acoustic wave device that has an excellent temperature coefficient of frequency (TCF) and is capable of resisting high temperature processing of 200 degrees or more while preventing the substrate from being warped during process.

BEST MODE FOR CARRYING OUT THE INVENTION

With reference to the attached drawings, an embodiment of the present invention will be described in detail below.

In a method for manufacturing an acoustic wave device of the present invention, an IDT (Inter-Digital Transducer) is formed on one principal surface of a piezoelectric substrate and then, a material having a smaller linear thermal expansion coefficient than the piezoelectric substrate is thermal sprayed on the opposite principal surface of the IDT-formed piezoelectric substrate to form a film thereon. Here, the acoustic wave device includes a surface acoustic wave (SAW) device and a buried propagating-layer acoustic wave device.

The piezoelectric substrate includes a lithium tantalate substrate (LT substrate), a lithium niobate substrate (LN substrate) and the like.

Figure 1:
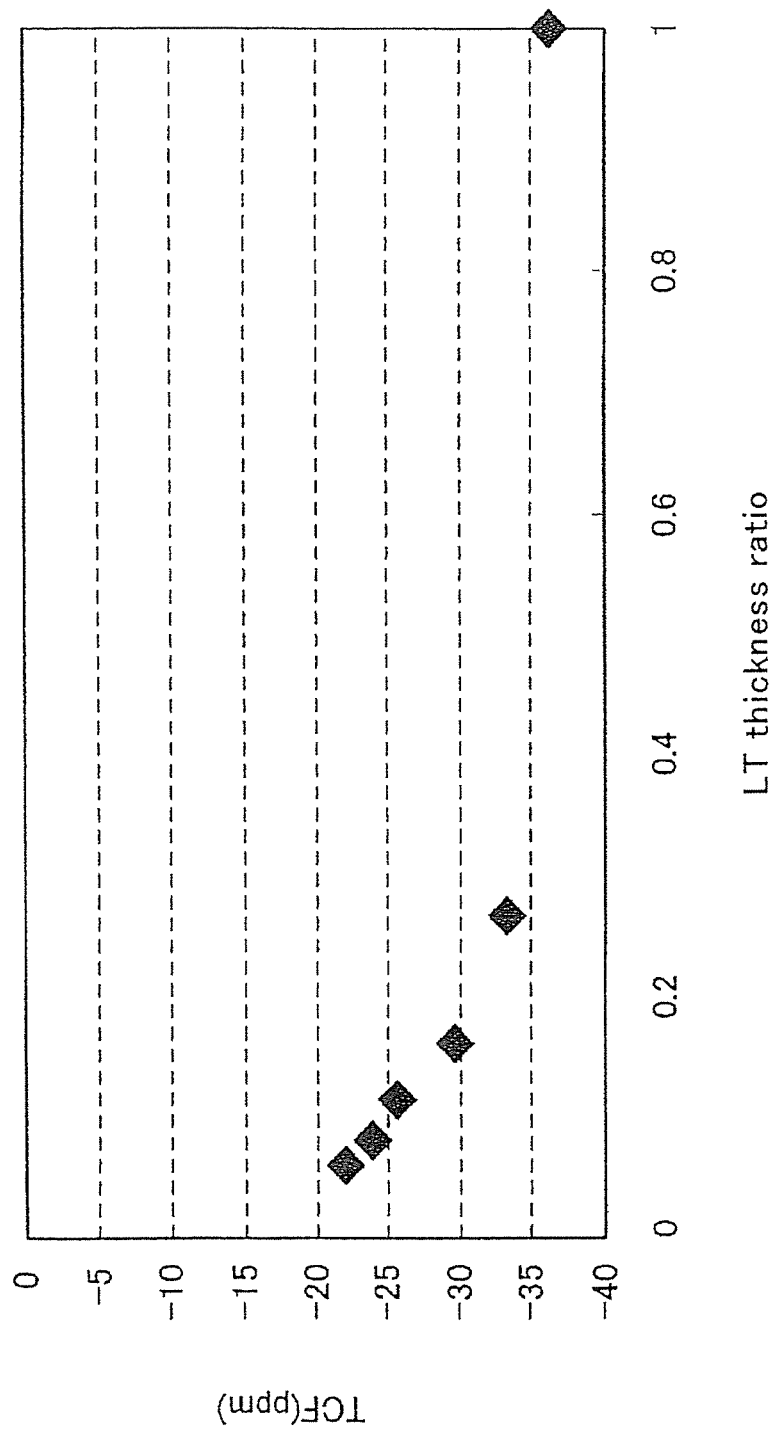
FIG. 1 is a view illustrating the relation between thickness of a piezoelectric substrate and temperature compensation effect.

Now, description is made about the relation between thickness of the piezoelectric substrate and temperature compensation effect. The temperature compensation effect of the acoustic wave device can be obtained from the temperature coefficient of frequency (TCF). FIG. 1 is a characteristic view illustrating the relation between temperature compensation effect and LT substrate thickness ratio (LT substrate thickness/substrate total thickness). The piezoelectric substrate used here is an LT substrate. As seen from FIG. 1, the smaller the ratio of the LT substrate thickness to the substrate total thickness is, the more enhanced the temperature compensation effect is. Thus, in terms of the temperature compensation effect, it is preferable that the ratio of the piezoelectric substrate thickness to the substrate total thickness is minimized, that is, the thickness of the LT substrate is minimized relative to the fixed substrate total thickness.

However, in the conventional bonded substrate, substrate surfaces are mirror-finished for boding substrates each other. Such mirror finishing of the substrate surfaces for excellent bonding needs polishing for the mirror finishing. In this polishing, a relatively high processing stress is applied to the substrates. Then, if the thickness of the piezoelectric substrate is reduced to enhance the temperature compensation effect, the piezoelectric substrate may be cracked by the stress in polishing. Therefore, in the bonded substrate, it is difficult to reduce the thickness of the piezoelectric substrate. Meanwhile, in the method of the present invention, there is no need to consider bonding of the substrates and polishing is unnecessary. Therefore, the thickness of the piezoelectric substrate can be reduced for enhancement of the temperature compensation effect.

In the acoustic wave device, bulk acoustic wave of acoustic wave generated on one principal surface where the IDT is formed is reflected off the opposite principal surface and this reflected wave interferes with the acoustic wave generated in the one principal surface. In order to reduce the influence of such bulk acoustic wave, it is preferable that the back surface of the piezoelectric substrate, that is, a surface where a thermal spray film is to be formed, is roughened. By this roughening of the back surface of the piezoelectric substrate, the bulk acoustic wave of the acoustic wave generated on the one principal surface where the IDT is formed can be prevented from being reflected off the opposite principal surface and interfering with the acoustic wave generated on the one principal surface. Further, roughening of the back surface of the piezoelectric substrate is also suitable for improvement of adhesion between the piezoelectric substrate and the thermal spray film (anchor bonding effect). For example, the surface roughness Ra of the back surface is preferably 0.01 μm to 3 μm.

For the above-mentioned roughening, the substrate surface is subjected to, for example, grinding, blasting, lapping or the like. Such processing is advantageous as the stress on the substrate is smaller than that applied in polishing and the influence on the substrate can be reduced. The roughness Ra of the back surface of the piezoelectric substrate is preferably 0.01 μm to 3 μm in consideration of adhesion of the thermal spray film to the piezoelectric substrate and the effect of preventing the influence by the reflected bulk wave.

As a material having a smaller linear thermal expansion coefficient than the piezoelectric substrate used in thermal spraying (material of the thermal spray film), alumina, mullite, silicon, yttria and the like may be used. Thermal splay deposition is a way for forming a film by using electric energy (arc, plasma) or combustion energy as a heat source, charging coating powder or bar material therein and spraying it on the surface of the substrate as fine particles in a molten or semi-molten state. By the adoption of this spray deposition, it is possible to effectively prevent the thermal influence on the piezoelectric substrate during deposition. This enables prevention of cracking and peel-off due to an increase in temperature in substrate processing.

The thermal spray film is usually porous and its rigidity is relatively small. Therefore, it is preferable pores of the film are filled by CVD (Chemical Vapor Deposition), PDV (Physical Vapor Deposition), SOG (Spin On Glass) or the like. This makes it possible to increase the rigidity of the thermal spray film and improve the temperature coefficient of frequency.

Further, the thermal spray film may have a plurality of layers. When the thermal spray film is a multi-layer film, various materials may be combined into the film thereby to be able to adjust the linear thermal expansion coefficient of the thermal spray film easily.

Figure 2:
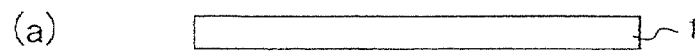
FIGS. 2(a) to 2(c) are views for explaining a method for manufacturing an acoustic wave device according to an embodiment of the present invention.
Figure 2:
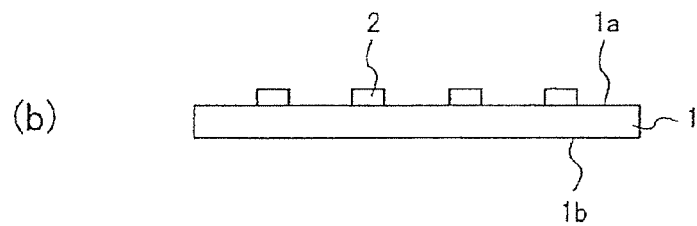
Figure 2:
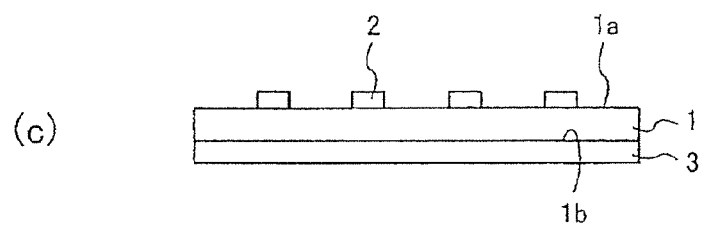

In the method for manufacturing an acoustic wave device of the present invention, the piezoelectric substrate 1 is prepared as illustrated in FIG. 2(a), and then, an IDT 2 is formed on one principal surface 1a of the substrate 1 as illustrated in FIG. 2(b). In forming of the IDT 2, an IDT electrode material is deposited on the principal surface 1a of the piezoelectric substrate 1 and a resist layer (not shown) is formed on the IDT electrode material layer (not shown). Then, the resist layer is exposed via a photomask at a region where the IDT is to be formed, and developed to be patterned. The patterned resist layer is used as a mask to etch the IDT electrode material layer. Then, a remaining part of the resist layer is removed. Here, there is no particular restriction on the shape of the IDT and its forming method.

Next, as illustrated in FIG. 2(c), a thermal spray film 3 is formed on the opposite principal surface (back surface) 1b of the piezoelectric substrate 1 by thermal spray deposition, the thermal spray film being made of a material having a smaller linear thermal expansion coefficient than the piezoelectric substrate 1. Where necessary, the thermal spray film is impregnated with SOG or the like and hardened thereby to improve the rigidity of the thermal spray film.

Figure 3:
FIGS. 3(a) to (d) are views for explaining another example of the method for manufacturing an acoustic wave device according to the embodiment of the present invention.
Figure 3:
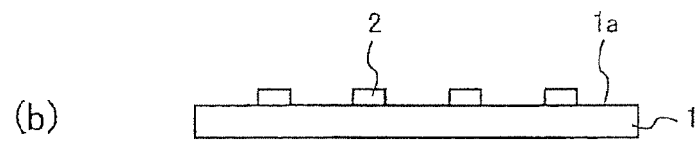
Figure 3:
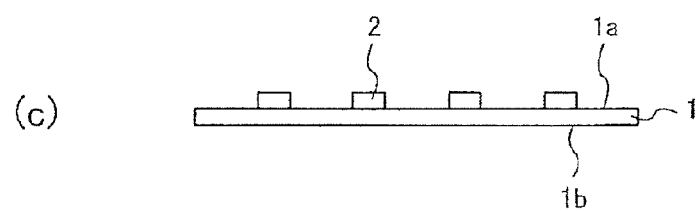
Figure 3:
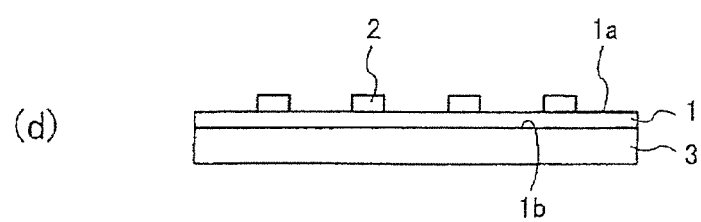

In the method for manufacturing an acoustic wave device, the piezoelectric substrate 1 is prepared as illustrated in FIG. 3(a), and an IDT 2 is formed on one principal surface 1a of the substrate 1 as illustrated in FIG. 3(b). Then, as illustrated in FIG. 3(c), the piezoelectric substrate 1 may be made thinner by reducing the thickness at the back surface 1b side before, as illustrated in FIG. 3(d), a thermal spray film 3 is formed on the back surface 1b of the piezoelectric substrate 1 by thermal spray deposition. Thickness reduction of the piezoelectric substrate 1 is performed, for example, by blasting, lapping, grinding or the like.

Figure 4:
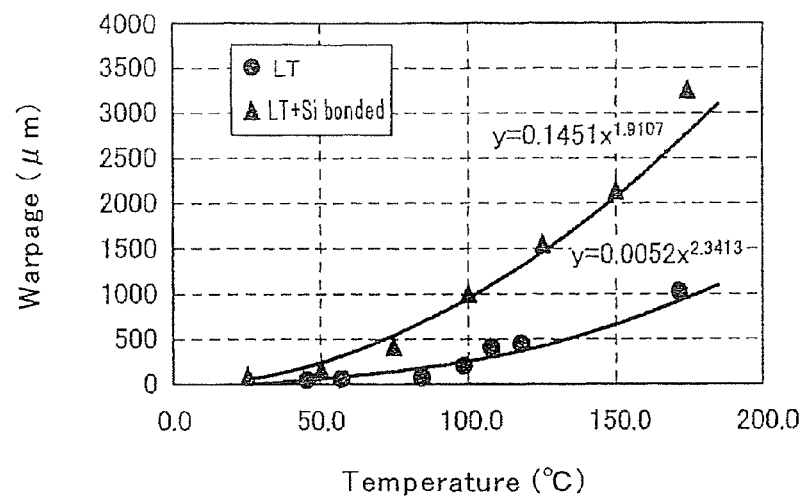
FIG. 4 is a view illustrating the relation between PEB temperature in forming of the IDT and wafer warpage.

Here, the relationship between PEB (Post Exposure Bake) temperature in IDT forming and warpage of the heated wafer is illustrated in FIG. 4. Here, the piezoelectric substrate used is an LT substrate. Besides, the warpage of the wafer in heating process was measured with a core9037a (product name by CORES CORPORATION). In FIG. 4, the warpage of a single 4-inch LT substrate (● plot) and the warpage of a 4-inch bonded substrate (LT substrate+Si substrate) (▲ plot) are plotted. As seen from FIG. 4, in the temperatures shown in the figure, the warpage of the single LT substrate is extremely smaller than that of the bonded substrate (LT substrate+Si substrate) at temperatures equal to or smaller than the temperature where the substrate is broken. Therefore, if the IDT is formed in the single LT substrate that shows small warpage in a heated state, the accuracy R of pattern line width processing in the wafer surface is improved. Here, the bonded substrate may be cracked or peeled at temperatures higher than the plotted temperature range shown in this figure.

Figure 5:
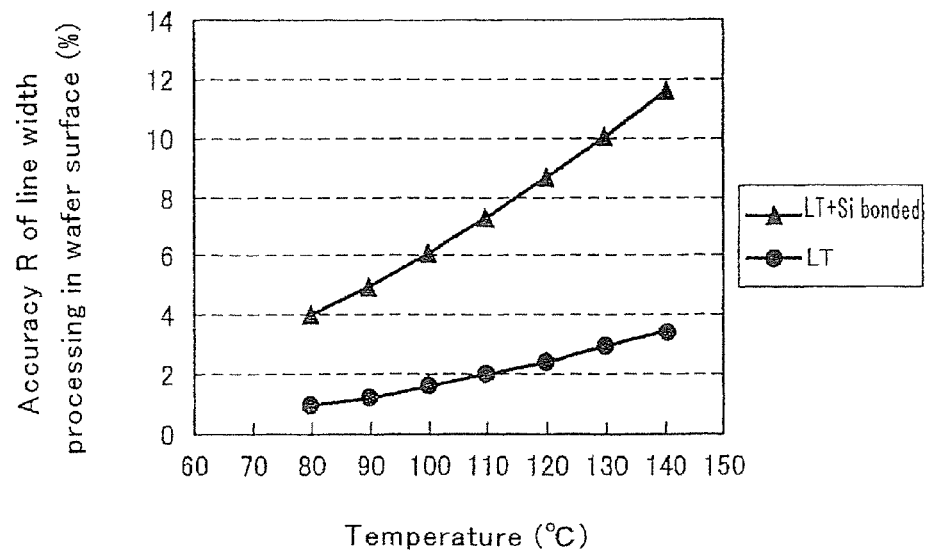
FIG. 5 is a view illustrating the relation between PEB temperature and the accuracy R of pattern line width processing in a wafer surface.

The relation between PEB temperature and accuracy R of pattern line width processing in the wafer surface is illustrated in FIG. 5. Here, the piezoelectric substrate used is an LT substrate. In FIG. 5, the accuracy R of pattern line width processing in the wafer surface of a single 4-inch LT substrate (line width processing accuracy in patterning directly in the LT substrate: ● plot) and the accuracy R of pattern line width processing in the wafer surface of a 4-inch bonded substrate (LT substrate+Si substrate) (line width processing accuracy in patterning in the bonded substrate: ▲ plot) are plotted. As seen from FIG. 5, according to the method of the present invention, the IDT is formed in the single LT substrate that shows small warpage in heating process, and therefore, the line width processing accuracy is improved. Meanwhile, as the warpage of the bonded substrate (LT substrate+Si substrate) is large in heating process, the PEB temperature in the wafer surface varies, which results in wide range of variation in resist line width. Consequently, the line width processing accuracy R is deteriorated. Particularly, when the PEB temperature becomes 130 degrees or more, the line width processing accuracy varies 10% or more.

Thus, in the acoustic wave device obtained by thermal spray deposition on the IDT-formed piezoelectric substrate, that is, acoustic wave device obtained by patterning in the piezoelectric substrate in advance, as the IDT is formed on the less-warped substrate, the IDT forming accuracy is improved finally. Further, as the surface to be thermal sprayed of the piezoelectric substrate is roughened, the influence of the bulk acoustic wave can be suppressed. Furthermore, according to the present invention, as there is no bonding of substrates, polishing of the substrate surfaces is not required and therefore, the piezoelectric substrate can be prevented from being cracked due to high processing stress in thickness reduction. Still furthermore, according to the method of the present invention, as the thermal spray deposition is adopted, no expensive bonding device is required and therefore, the acoustic wave device having an excellent TCF can be manufactured at low cost.

Next description is made about examples made to clarify the effect of the present invention.

First, the example 1 is used to explain the high-temperature processing characteristics.

Example 1

A substrate of lithium tantalate (LT substrate) was provided having a linear thermal expansion coefficient of $16\times10^{-6}$/K and a thickness of 0.02 mm, and mullite having a linear thermal expansion coefficient of $1\times10^{-6}$/K was thermal sprayed on one principal surface of the substrate at a thickness of 0.33 mm, thereby forming a 4-inch substrate. This 4-inch substrate was subjected to heating. Then, the 4-inch substrate was not cracked at heating temperatures of 180 and 200 degrees, however it was cracked at heating temperatures of 250 and 350 degrees.

Besides, instead of the LT substrate, a substrate of lithium niobate (LN substrate) having a linear thermal expansion coefficient of $15\times10^{-6}$/K and a thickness of 0.02 mm was used thereby to form a 4-inch substrate in the same way as mentioned above. This 4-inch substrate was subjected to heating. Then, the 4-inch substrate was not cracked at the heating temperatures of 180 and 200 degrees, however, it was cracked at the heating temperatures of 250 and 350 degrees.

Further, a substrate of lithium tantalate (LT substrate) was provided having a linear thermal expansion coefficient of $16\times10^{-6}$/K, a diameter of 4 inches and a thickness of 0.25 mm, and a silicon substrate for temperature compensation having a linear thermal expansion coefficient of $3\times10^{-6}$/K, a diameter of 4 inches and a thickness of 0.33 mm was bonded directly onto one principal surface of the LT substrate by surface activated bonding. Then, the silicon surface was subjected to lapping and polishing, thereby thinning the bonded substrate to have a thickness of 0.02 mm. Here, the surfaces to be bonded of LT substrate and the silicon substrate were mirror finished in advance. Then, this bonded substrate was subjected to heating. At that time, the LT substrate was cracked even at heating temperatures of 180 and 200 degrees.

If the piezoelectric substrate such as the LT substrate or LN substrate is subjected to processing for temperature compensation before the IDT is formed thereon, there exists a high-temperature process of about 200 degrees such as a cure process of a resin layer. Accordingly, in consideration of the above-described results, if the IDT is formed after the temperature compensating processing on the piezoelectric substrate, the piezoelectric substrate may be cracked in the high-temperature process. However, according to the method of the present invention, as the IDT is first formed on the piezoelectric substrate and then, the thermal spray deposition is formed for temperature compensation, the piezoelectric substrate is prevented from being subjected to the high-temperature process after the processing for temperature compensation. Therefore, it is possible to manufacture an acoustic wave device having an excellent TCF and no crack in the substrate.

Next description is made about the temperature characteristic evaluation and the influence of the bulk acoustic wave, using the example 2.

Example 2

An IDT was formed on one principal surface of a substrate of lithium tantalate (LT substrate) having a linear thermal expansion coefficient of $16\times10^{-6}$/K, a diameter of 4 inches and a thickness of 0.25 mm. In this IDT forming, the resist used was a chemical amplification resist and the PEB (Post Exposure Bake) temperature was 110 degrees. Then, the opposite principal surface of the LT substrate was lapped to a thickness of 0.01 to 0.04 mm and roughened at Ra of 0.1 μm. Next, powders of silicon and alumina were thermal sprayed in this order on the roughened opposite principal surface so that a total thickness of the LT substrate and the thermal spray film was 0.25 mm. Here, the thermal spraying was performed with use of a DC plasma thermal spray device using Ar plasma gas and at power supply output of 40 kW.

The thus obtained wafer with IDT was examined as to the accuracy R of line width processing in the surface. This accuracy R was measured with an SEM (Scanning Electron Microscope). As a result of measurement, the accuracy R of line width processing in the wafer surface was about 2%. As described above, this is thought to be because the wafer warpage in the high-temperature processing is suppressed and variation in resist line width can be minimized.

Figure 6:
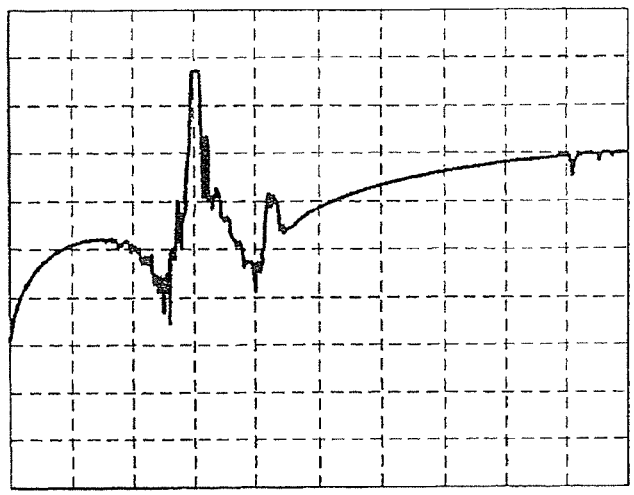
FIGS. 6(a) and (b) are views illustrating influence by bulk acoustic wave on the acoustic wave device.
Figure 6:
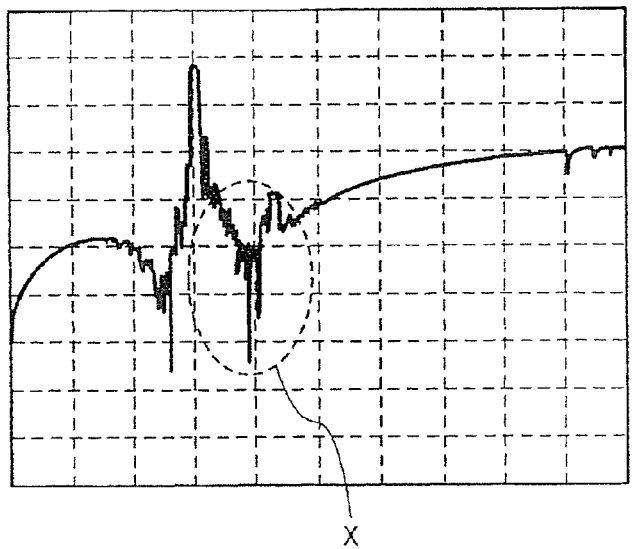

Further, when the thus obtained wafer was diced into an acoustic wave device (SAW device) and the temperature compensation effect of the acoustic wave device was investigated, improvement as illustrated in FIG. 1 was recognized. Furthermore, the waveform of the acoustic wave device is illustrated in FIG. 6(a). Here, for reference, the waveform of the acoustic wave device obtained with use of the bonded substrate formed in the example 1 is illustrated in FIG. 6(b). The X part in FIG. 6(b) exhibits ripple due to the influence of the bulk acoustic wave. As seen from FIG. 6(a), there is no ripple shown in the acoustic wave device obtained in the method according to the present invention. This is thought to be because roughening of the thermal spray surface prevents the bulk acoustic wave of the acoustic wave generated on the IDT-formed one principal surface from being reflected off the opposite surface to interfere with the acoustic wave generated on the one principal surface.

The present invention is not limited to the above-described embodiment and may be embodied in various modified forms. The shapes, dimensions, materials in the above-described embodiment and so on are merely given by way of example and may be modified appropriately as far as the effect of the present invention is not adversely affected. Further, the present invention may be embodied in various modified forms without departing from the scope of the present invention.

The invention claimed is:

1. A method for manufacturing an acoustic wave device, comprising the steps of:
   forming an inter-digital transducer on one principal surface of a piezoelectric substrate;
   forming a porous film by spraying a material having a smaller linear thermal expansion coefficient than the piezoelectric substrate on a surface opposite to the principal surface of the piezoelectric substrate after forming the inter-digital transducer on the principal surface of the piezoelectric substrate; and
   filling pores in the porous film formed by spraying with a filling material.

2. The method of claim 1, further comprising, before forming the porous film by spraying, a step of roughening the surface opposite to the principal surface of the piezoelectric substrate.

3. The method of claim 2, wherein the surface opposite to the principal surface has Ra of 0.01 μm to 3 μm.

4. The method of claim 1, further comprising, before forming the porous film by spraying, a step of thinning the piezoelectric substrate by reducing a thickness at a side of the surface opposite to the principal surface of the piezoelectric substrate.

5. The method of claim 1, wherein the material comprises at least one selected from the group consisting of mullite, alumina, silicon and yttria.

6. The method of claim 5, wherein the piezoelectric substrate is a lithium tantalate substrate or a lithium niobate substrate.

7. The method of claim 1, wherein the piezoelectric substrate is a lithium tantalate substrate or a lithium niobate substrate.

8. The method of claim 1, wherein the material comprises at least one selected from the group consisting of mullite, alumina, silicon and yttria.

9. The method of claim 1, wherein the piezoelectric substrate is a lithium tantalate substrate or a lithium niobate substrate.

10. The method of claim 1, wherein the step of filling the pores in the porous film includes filling the pores in the porous film using processes selected from the group of chemical vapor deposition, physical vapor deposition, and spin on glass.

11. The method of claim 1, wherein forming the porous film by spraying the material is forming a multi-layered film by spraying.

12. The method of claim 11, wherein forming the multi-layered film by spraying comprises forming the multi-layered film from a plurality of materials.

* * * * *